US012668867B2

(12) United States Patent (10) Patent No.: US 12,668,867 B2
Mehta et al. (45) Date of Patent: Jun. 30, 2026

(54) ION BEAM DEPOSITION OF RUTHENIUM THIN FILMS

(71) Applicant: VEECO INSTRUMENTS INC., Plainview, NY (US)

(72) Inventors: Rutvik J. Mehta, Plainview, NY (US); Yuejing Wang, Plainview, NY (US); Robert Caldwell, Plainview, NY (US); Frank Cerio, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 144 days.

(21) Appl. No.: 18/467,549

(22) Filed: Sep. 14, 2023

(65) Prior Publication Data

US 2024/0102150 A1 Mar. 28, 2024

Related U.S. Application Data

(60) Provisional application No. 63/377,065, filed on Sep. 26, 2022.

(51) Int. Cl.
 *C23C 14/14* (2006.01)
 *C23C 14/22* (2006.01)
(52) U.S. Cl.
 CPC ............ *C23C 14/221* (2013.01); *C23C 14/14* (2013.01)
(58) Field of Classification Search
 None
 See application file for complete search history.

(56) References Cited

U.S. PATENT DOCUMENTS 11,447,857 B2 9/2022 Hou et al.
2006/0063025 A1 3/2006 Huang et al.

OTHER PUBLICATIONS

Sameer S. Ezzat, Prabhu Doss Mani, Asim Khaniya, William Kaden, Daniel Gall, Katayun Barmak, Kevin R. Coffey; Resistivity and surface scattering of (0001) single crystal ruthenium thin films. J. Vac. Sci. Technol. A May 1, 2019; 37 (3): 031516. https://doi.org/10.1116/1.5093494 (Year: 2019).*

* cited by examiner

*Primary Examiner* — Daniel J. Schleis
(74) *Attorney, Agent, or Firm* — HOLZER PATEL DRENNAN

(57) ABSTRACT

Methods for forming a low resistivity ruthenium (Ru) thin film that include depositing ruthenium onto a substrate via ion beam deposition with assist ion beam in a process chamber having reactive and noble gas species therein. The substrate is at at least 250° C. A resulting thin ruthenium film has a thickness of no more than 30 nm, a resistivity less than 12 μ·cm and a crystalline structure comprising grains having a (0001) orientation. The resistivity will differ at different thickness; for example, less than 9 μΩ-cm for films of 50 nm and thicker, less than 9.5 μΩ-cm for films of 35 nm and thicker, less than 11 μΩ-cm for films of 20 nm and thicker, less than 15 μΩ-cm for films of 10 nm and thicker or less than 20 μΩ-cm for films of 2 nm and thicker. The grains have a mean grain size at least three times the film thickness.

26 Claims, 8 Drawing Sheets

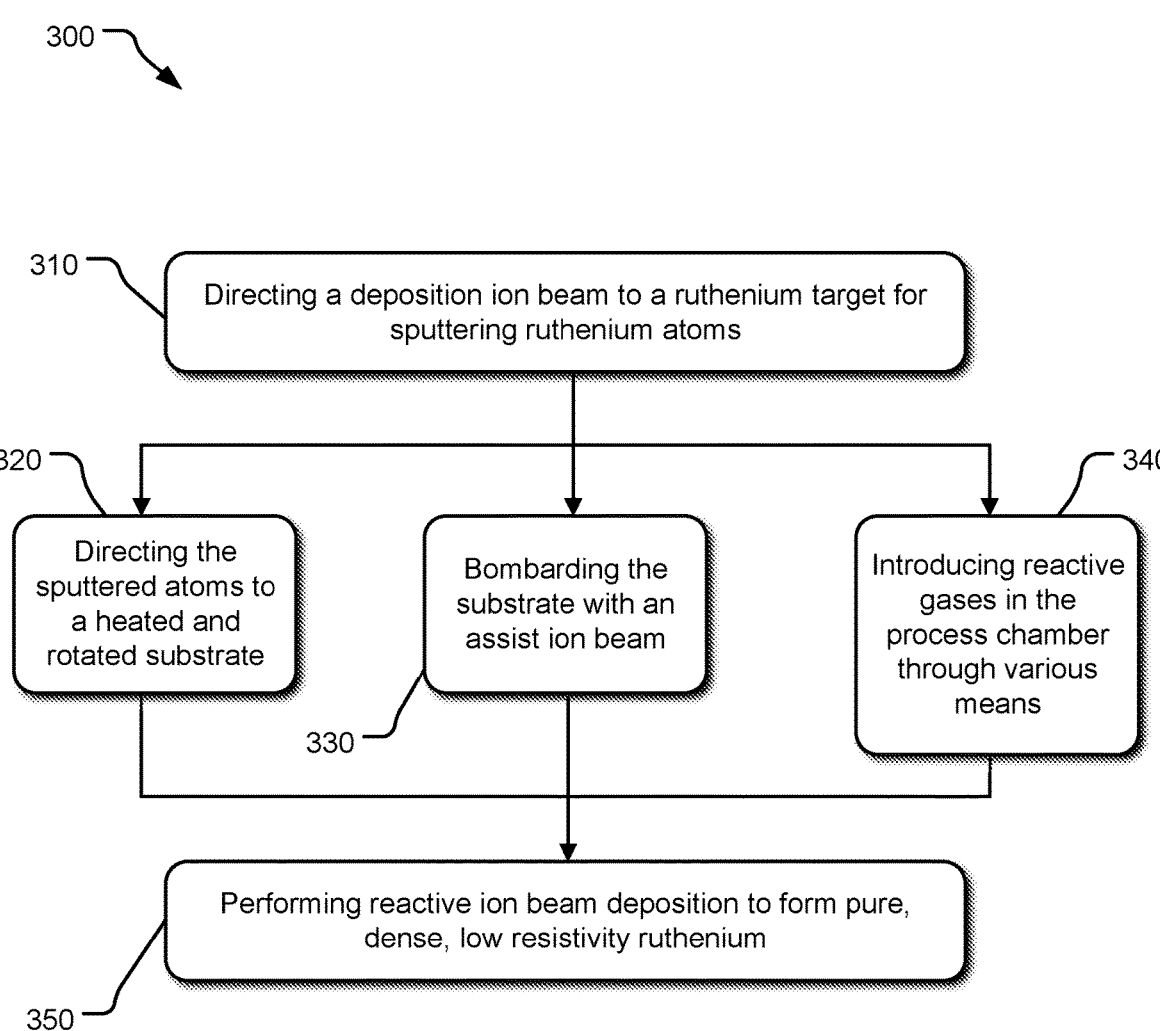

300

310 — Directing a deposition ion beam to a ruthenium target for sputtering ruthenium atoms 320 — Directing the sputtered atoms to a heated and rotated substrate 330 — Bombarding the substrate with an assist ion beam 340 — Introducing reactive gases in the process chamber through various means 350 — Performing reactive ion beam deposition to form pure, dense, low resistivity ruthenium

FIG. 3

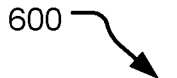
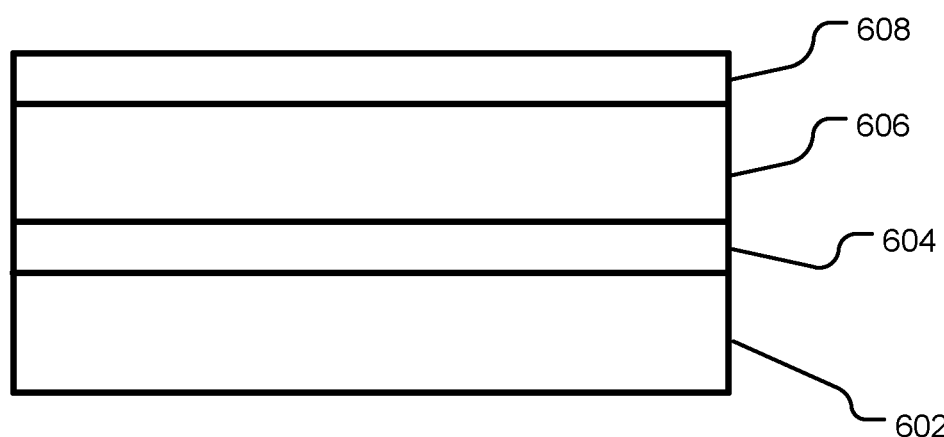
FIG. 6

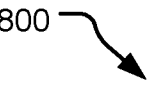

800

810 — Select a target for deposition of desired underlayer thin film, e.g., from multi-target turret 820 — Perform reactive ion beam deposition to deposit desired underlayer thin film 830 — Select a ruthenium target for deposition of a ruthenium thin film, e.g., from multi-target turret 840 — Perform reactive ion beam deposition to deposit low resistivity ruthenium thin film 850 — Select a target for deposition of desired capping thin film e.g., from multi-target turret 860 — Perform reactive ion beam deposition to deposit desired capping thin film

FIG. 8

ION BEAM DEPOSITION OF RUTHENIUM THIN FILMS

CROSS-REFERENCE

This application claims priority to U.S. provisional application Ser. No. 63/377,065 filed Sep. 26, 2022 and titled ION BEAM DEPOSITION OF RUTHENIUM THIN FILMS, the entire disclosure of which is incorporated herein by reference for all purposes.

BACKGROUND

The continuing scaling down of electronic devices in the sub-micron era poses challenges to the metallic conductors used for the wiring and interconnection networks due to the phenomenon of the resistivity of metals increasing as physical dimensions such as length, width and height of the wires approaching or becoming smaller than the electron mean free path. The size-dependent resistivity increase originates primarily through increased electron scattering at the metal surfaces and layer boundaries and is exacerbated by increased scattering from not only surface roughness but also at grain boundaries of the polycrystalline structure of the metal which typically becomes finer with downscaling. The resistivity increase is a major challenge particularly for copper for continued down scaling of the most critical and smallest interconnects in integrated circuits and severely limits the use of copper for their wiring, prompting efforts for identifying replacement metals. Ruthenium is a promising candidate metal to replace copper in integrated device wiring due to the significantly lower bulk mean free path almost five times smaller than for copper, presaging a correspondingly smaller resistivity size effect.

The resistivity size effect is typically quantified using the classical models that account for both surface scattering, and grain boundary scattering, and both model prediction and experimental observations reveal a resistivity increase that is directly proportional to the bulk resistivity and the bulk mean free path, both of which are material choice dependent, and also inversely proportional to the distance between scattering interfaces, which include the film thickness, wire width and height and average grain size, all of which scale with dimensions but with the latter especially dependent on the metal microstructural features. Additionally, ruthenium and other metals such as tungsten, demonstrate a size-dependent anisotropic electrical resistivity where the normally isotropic resistivity shows a dependence on the grain texture, orientation, and epitaxy. Modeling and experimental work in the literature show that for Ru, (0001) orientation with conduction along the hexagonal c-axis is the most favorable for low resistivity. Furthermore, the resistivity of metals is a strong function of the microstructure which consists of features such as the grain size distribution characteristics consisting of grain boundaries with variable spacing and their frequencies, and orientation, which influence the electron scattering mechanics. Consequently, while a metal with a small mean free path is a promising candidate, in practice the observed resistivity of nanometer-scale conductors is highly dependent on the microstructure of the thin films from which they are fabricated and hence on the capabilities of the thin film growth methods.

Optimizing the microstructures of metal thin films to achieve the lowest resistivity can be very challenging. Unfavorable microstructures, impurities, random grain orientations and small grain sizes can increase resistivities even for low mean free path metals. It is necessary to deposit high-purity metal thin films with low resistivity phases and favorable crystalline grain orientations, as well as large grain sizes to mitigate scaling size effects. For example, it is well-known in the literature that ruthenium thin films require post-deposition annealing or high temperatures during deposition for grain growth and practical achievement of low resistivity and low resistivity size effects. As is also well-known in the literature, sputter thin film growth and hence properties are a strong and complex function of the material, substrate, substrate temperature, surface chemistry, background and process gas species, deposition environment chemistry, energy and flux of the sputtered atoms.

Ion beam deposition (IBD) is one of many methods suitable for forming metallic films, the other methods including (but not limited to) plasma vapor deposition (PVD), chemical vapor deposition (CVD), and molecular beam epitaxy (MBE). MBE is useful for depositing layers at very low energy, which can produce pseudo epitaxial layers. PVD is useful for depositing layers at a higher energy, which can produce layers that have, e.g., good electrical conductivity capabilities. IBD is useful for depositing layers at still higher energy and reduced pressures and with control of deposition geometry, which can produce layers with higher crystallinity and with controlled microstructures.

With all these methods, various thickness of films can be produced. Below certain thicknesses, as the metal film thickness decreases, the resistivity of the metal increases.

SUMMARY

The present disclosure is directed to methods of forming thin layers of a metal, for example, ruthenium (Ru), having low resistivity, by ion beam deposition. Addition of an assist ion beam and/or heating of the process and/or reactive gases further lowers the resistivity. The thin film layers of ruthenium (e.g., no more than 50 nm, in some embodiments no more than 35 nm or 30 nm thick) obtained by the methods may be pure (e.g., at least 99% ruthenium) and dense (e.g., at least 12.2 g.cm3 or at least 99% of the theoretical density, which is 12.37-12.41 $g/cm^3$).

The methods include depositing ruthenium metal onto a substrate via ion beam deposition with assist, and in some embodiments, via reactive ion beam deposition, in a process chamber at a temperature not higher than 600° C. and in other embodiments, not higher than 450° C. To reduce the ruthenium thin film resistivity, the method can include an in-situ use of and/or assistance with reactive gas species.

In some embodiments, the reactive ion beam deposition includes introduction of one or both of a reactive gas species and a noble gas species into the deposition sputter ion beam. To reduce the thin film resistivity, the method can include introduction of the same or different reactive gas species and/or noble gas species with an assist ion beam.

A resulting thin ruthenium film can have large and highly oriented (0001) grains with at least 95%, and up to the entire, of the deposited ruthenium thin film having a (0001) crystalline orientation plane, relative to the top surface of the substrate; these grains may be parallel to the top surface of the substrate in some embodiments, and perpendicular in others. The grain size distribution can be such that the average grain size is at least three times, and up to ten times, the film thickness in the as-deposited state without additional annealing. Additionally, the resulting thin ruthenium film can have a low resistivity at different thickness, for example, less than 9 μΩ-cm for film thickness of 50 nm and thicker, less than 9.5 μΩ-cm for film thickness of 35 nm and thicker, less than 11 μΩ-cm for film thickness of 20 nm and thicker, less than 15 $\mu\Omega$-cm for film thickness of 10 nm and thicker or less than 20 $\mu\Omega$-cm for film thickness of 2 nm and thicker.

In some embodiments, the resulting low resistivity ruthenium thin film has been deposited onto a dielectric barrier film deposited in-situ on the substrate using a reactive ion beam deposition process. A dielectric capping film may be deposited onto the resulting low resistivity ruthenium thin film in-situ using a reactive ion beam deposition process. Thus, the resulting thin ruthenium film may be sandwiched between the dielectric barrier film and the dielectric capping film. The same dielectric can used as the barrier film and capping film or different dielectrics can be used for the barrier film and capping film.

In one particular implementation, this disclosure provides a method of forming a thin ruthenium film, the method comprising depositing a ruthenium film from a ruthenium target onto a substrate via ion beam deposition in a process chamber in the presence of a reactive gas species, the substrate at a temperature of at least 250° C., and simultaneously bombarding at least some of the deposited ruthenium in the process chamber with an assist ion beam in the presence of a noble gas species.

In an alternate particular implementation, this disclosure provides a method of forming a thin ruthenium film, the method comprising depositing a ruthenium film from a ruthenium target onto a substrate via ion beam deposition in a process chamber in the presence of a noble gas species, the substrate at a temperature of at least 250° C., and simultaneously bombarding at least some of the deposited ruthenium in the process chamber with an assist ion beam in the presence of a reactive gas species.

Other arrangements of adding one or more reactive gas species and one or more noble gas species are also disclosed.

In another particular implementation, this disclosure provides a ruthenium film having a thickness of no more than 30 nm with a resistivity of less than 12 $\mu\Omega$-cm, and a crystalline structure comprising grains having a (0001) orientation. In some instances, this disclosure provides low resistivity ruthenium films at different thickness, such as less than 9 $\mu\Omega$-cm for film thickness of 50 nm and thicker, less than 9.5 $\mu\Omega$-cm for film thickness of 35 nm and thicker, less than 11 $\mu\Omega$-cm for film thickness of 20 nm and thicker, less than 15 $\mu\Omega$-cm for film thickness of 10 nm and thicker or less than 20 $\mu\Omega$-cm for film thickness of 2 nm and thicker, the films having a crystalline structure comprising grains having a (0001) orientation.

This Summary is provided to introduce a selection of concepts in a simplified form that are further described below in the Detailed Description. This Summary is not intended to identify key or essential features of the claimed subject matter, nor is it intended to be used to limit the scope of the claimed subject matter. These and various other features and advantages will be apparent from a reading of the following Detailed Description.

BRIEF DESCRIPTION OF THE DRAWING

FIG. 3 is a stepwise method for depositing a ruthenium thin film.

FIG. 6 is a schematic side view of a multiple-layer ruthenium thin film structure.

FIG. 8 is a stepwise method for depositing a multiple-layer ruthenium thin film structure.

DETAILED DESCRIPTION

Figure 1:
FIG. 1 is a schematic side view of an ion beam deposition system with an assist ion beam.

As indicated above, this disclosure is directed to methods of forming low resistivity, thin layers or films of a metal (e.g., ruthenium) by ion beam deposition. The methods include using reactive ion beam deposition, with one or more of elevated processing temperatures, reactive gases as background process gas, as primary ions, or as secondary ions. A particular method includes utilizing a heated substrate during reactive ion beam deposition with assist ion beam.

The continued scaling down of electronic devices in the sub-micron era poses challenges to the metallic conductors used for the wiring and interconnection networks due to the phenomenon of the resistivity of metals increasing as physical dimensions such as length, width and height of the wires decrease, approaching or becoming smaller than the electron mean free path. The size-dependent resistivity increase originates primarily through increased electron scattering at the metal surfaces and layer boundaries and is exacerbated by increased scattering from not only surface roughness but also at grain boundaries of the polycrystalline structure of the metal, which typically becomes finer with downscaling. The resistivity increase is a challenge, particularly for copper, for continued down scaling of the most critical and smallest interconnects in integrated circuits and severely limits the use of certain metals, such as copper, for their wiring, prompting efforts to identify replacement metals. Ruthenium is a promising candidate metal to replace copper in integrated device wiring due to the significantly lower bulk mean free path (e.g., almost five times smaller than for copper), presenting a correspondingly smaller resistivity size effect.

The resistivity size effect is typically quantified using classical models that account for both surface scattering and grain boundary scattering. Both model prediction and experimental observations reveal a resistivity increase that is directly proportional to the bulk resistivity and the bulk mean free path, both of which are material choice dependent, and also inversely proportional to the distance between scattering interfaces, which include the film thickness, wire width and height and average grain size, all of which scale with dimensions but with the latter especially dependent on the metal microstructural features. Ruthenium demonstrates a size-dependent anisotropic electrical resistivity where the normally isotropic resistivity shows a dependence on the grain texture, orientation, and epitaxy. Modeling and experimental work show that for Ru, the (0001) orientation with conduction along the hexagonal c-axis is the most favorable for low resistivity. Furthermore, the resistivity of metals is a strong function of the microstructure, including features such as the grain size distribution characteristics, which includes grain boundaries with variable spacing and their frequencies, and grain orientation, which influences the electron scattering mechanics.

While a metal with a small mean free path is a promising candidate, in practice, the observed resistivity of nanometer-scale conductors is highly dependent on the microstructure of the thin films from which they are fabricated, which is dependent on the thin film growth methods.

The thin film growth and resulting properties are a strong and complex function of the material, substrate, substrate temperature, surface chemistry, background and process gas species, deposition environment chemistry, energy and flux of the sputtered atoms, and post processing. Optimizing the microstructures of metal thin films to achieve the lowest resistivity can be very challenging. Unfavorable microstructures, impurities, random grain orientations and small grain sizes can increase resistivities even for low mean free path metals. For favorable results, the metal thin films are high purity with low resistivity phases and favorable crystalline grain orientations, as well as large grain sizes to mitigate scaling size effects. For example, it is well-known that ruthenium thin films require post-deposition annealing or exposure to high temperatures during deposition to achieve low resistivity and low resistivity size effects.

Ion beam deposition with ion assist is a thin film technology with unique features capable of tuning the microstructures of thin films through density, purity, phase, texture control, and grain size growth to attain low resistivity in metals. Fundamentally, in ion beam deposition, the sputter beam and the generation of the film forming sputter plume and thin film growth with the assist ion beam are spatially separated. In addition, both the deposition and assist ion beams are mono-energetic with independent control of the energy and flux of both beams. The combination of these features permits the deposition of high-purity films under relatively low pressures, e.g., less than 0.1 to 0.01 mtorr, with low thermalization and fine control of the film deposition and growth energetics. Both deposition and assist ion beams are highly selective and repeatable with narrow mono-energetic energy distributions. By changing the ion beam parameters of both beams appropriately, the energy distributions of the film-forming neutrals and atoms are modified, significantly influencing the thin film growth modes and the microstructure evolution. The fine control of the energetics and energy distributions during metal thin film deposition and growth permits the creation of selective microstructures in ion beam deposition.

In addition, ion beam deposition allows fine control of the background and process gas species, and reactive gas species can be used as ions in a background gas or as primary ions in a reactive ion beam deposition. Reactive ion beam deposition with reactive gas species, such as, e.g., oxygen or nitrogen, when used in conjunction with a metal target, results in the deposition of and creation of compound dielectric thin films containing the reactive gas species, e.g., a metal oxide or metal nitride, respectively, and the metal from the target. As metal thin films require a high purity composition to achieve low resistivity, reactive sputter deposition of pure metals is not conventionally done.

However, described herein are particular methods of utilizing reactive ion beam deposition with either or both of a reactive gas species and a noble gas species to form ruthenium thin films for integrated circuit wiring using ruthenium targets. The reactive gas species and/or the noble gas species can be in the primary ion beam and/or secondary ion beam and optionally as a background process gas distributed in the chamber. The various methods and apparatus described herein, and combinations thereof, are able to produce dense, high-purity ruthenium metal films with grain size distributions having mean grain sizes at least three times and more than ten times greater than the film thickness and near-ideal 0001 orientation and texture with a concomitant ultra-low resistivity (e.g., less than 11 $\mu\Omega$-cm for thin films of less than 20 nm thickness) in the as-deposited state requiring no additional steps such as annealing and other thermal treatments.

This ability to deposit pure, dense, low resistivity ruthenium using reactive ion beam deposition, with reactive gases used in the process, permits the deposition of such a ruthenium thin film onto a dielectric, metal or other thin film underlayer, the underlayer deposited by reactive ion beam deposition in-situ without requiring the use of another process chamber, a process-break or additional steps, e.g., to purge reactive gases from the chamber. Additionally, this reactive ion beam deposition also permits the deposition of a dielectric, metal or other thin film as a capping layer on the deposited ruthenium thin film by reactive ion beam deposition in-situ without requiring the use of another process chamber, a process-break or additional steps. This is in contrast to extant methods used for thin film deposition such as chemical vapor deposition, atomic layer deposition, plasma vapor deposition and other sputter deposition, and other methods where pure metal thin films cannot be deposited in-situ with dielectric thin films in the same chamber. With these known methods, separate process chambers are required for deposition of multiple thin film layers of dielectric and metal layers, or metal layers sandwiched between dielectric or other layers.

The methods described herein can form films of predominantly 0001 ruthenium, having a highly oriented grain texture with preferred orientation of grains with the low resistivity basal 0001 planes and 0001 hexagonal axis direction and grain size distribution with mean grain sizes as much as three times as large and more than ten times as large as the thin film thickness.

One particular method includes depositing ruthenium from a target onto a substrate via ion beam deposition in a process chamber, the substrate at a temperature of at least 300° C., or at least 350° C., or at least 400° C., or at least 450° C.; in some embodiments, the substrate temperature does not exceed 600° C.

In some instances, the ion beam deposition is done in a reactive ion beam deposition manner with various gases including background process gases such as, e.g., inert noble gases like argon, krypton, xenon, and, e.g., reactive process gases such as, but not limited to, gases containing oxygen, nitrogen, fluorine, hydrogen and other reactive gases.

Bombarding can be done using an assist ion beam to modify or etch at least some of the deposited material. In some instances, this bombarding is done in a reactive assist ion beam manner with background process gases such as, e.g., inert gases like noble gases argon, krypton and xenon, and, e.g., reactive process gases such as, e.g., gases containing oxygen, nitrogen, fluorine, or hydrogen, including nitric oxide (NO), nitrogen dioxide ($NO_2$), ammonia ($NH_3$), and fluoride. In some instances, the ion beam deposition and ion beam assist are done while simultaneously introducing reactive process gases such as, e.g., gases containing oxygen, nitrogen, fluorine, or hydrogen, through a gas distributor apparatus designed to controllably provide the gases during deposition.

The methods described herein can be used to form a ruthenium film having a thickness of at least 1 nanometer, in some embodiments about 10 to about 30 nanometers with a resistivity of about 8 to about 12 $\mu\Omega$-cm; in some embodiments, the film has a resistivity of about 8 to about 10 $\mu\Omega$-cm. As an example, the methods described herein can be used to form a ruthenium film about 10 to about 20 nanometers thick with a resistivity of about 8 to about 10 $\mu\Omega$-cm. In some instances, the methods can be used to form a ruthenium film having low resistivity at different thickness, such as less than 9$\mu\Omega$-cm for film thickness of 50 nm and thicker, less than 9.5 $\mu\Omega$-cm for film thickness of 35 nm and thicker, less than 11 $\mu\Omega$-cm for film thickness of 20 nm and thicker, less than 15 $\mu\Omega$-cm for film thickness of 10 nm and thicker or less than 20 $\mu\Omega$-cm for film thickness of 2 nm and thicker.

A ruthenium film made by the described methods may have a highly oriented microstructure with a dominant 0001 orientation, defined as a majority of grains (e.g., greater than 60%, 70%, 80%, 90%, 95%, and up to >99% of grains) oriented with low resistivity 0001 hexagonal basal planes along the film plane in some embodiments, and along the film growth directions (i.e., perpendicular to the film plane) in other embodiments. A ruthenium film made by these methods may be high purity and have little or no impurities of the reactive gas species or the noble gas species contained in the thin film. A ruthenium film made by these methods may have a low resistivity hexagonal 0001 fiber texture. A ruthenium film may have a crystal orientation of hexagonal 0001 as signified with X-ray diffraction showing high intensity of 0001 planes.

A ruthenium film made by these methods may have a highly controlled microstructure with grain size distribution and grain orientation distribution tunable by the method used to form the film. The film microstructure can be tailored to grains growing to certain sizes and along specific planes and directions. The film may be a highly textured large-grained film. For example, the methods described herein can be used to form a ruthenium film having a grain orientation distribution characterized by a majority of grains having orientation along certain crystallographic planes and direction, e.g., a majority or up to all grains oriented along hexagonal basal 0001 planes or along 0001 direction of the crystal hexagonal axis. A ruthenium film made by these methods may have a grain size distribution characterized by large mean grain size e.g., at least three time as large and even more than ten times as large as the film thickness. That is, the ruthenium film has grain sizes greater than the thickness of the film, the grain size (e.g., diameter) measured in the plane of the film. As an example, the methods described herein can be used to form a ruthenium film having a thickness of about 2 to about 50 nanometers having a grain size distribution with a mean grain size of greater than 50 nanometers equivalent circular diameter, and in some instances, grain sizes larger than 100 nanometers, and in other instances, grain sizes larger than 200 nanometers, even larger than 300 nanometers, and even larger than 500 nanometers in some instances.

Still further, this disclosure describes methods for controlling the microstructure, texture and grain orientation of ruthenium films with use of, in combination or individually, reactive gas species and/or noble gas species, assist ion etch source, ion beam deposition source, heat and reactive ion beam deposition and etching.

This disclosure also provides, in a particular implementation, a method of forming a thin ruthenium film, the method comprising depositing ruthenium from a target onto a substrate via ion beam deposition in a process chamber, the substrate at a temperature of at least 400° C. and in some embodiments up to 600° C., and simultaneously bombarding at least some of the material deposited from the substrate in the process chamber, such as with an assist ion beam. In another particular implementation, this disclosure provides a method of forming a ruthenium film via ion beam deposition with the target moveable in a turret indexed to a position relative to the deposition ion beam and to the substrate assembly to present a particular geometric angle.

For any of these methods, process gases can be used with the ion deposition beam and assist ion beam to form the primary ions. For example, the primary ions in the deposition and assist ion beams can be from inert gases used as process gases, gases such as argon, krypton, xenon and other noble gas(es). Additionally or alternately, the primary ions in the deposition and assist ion beams can be from reactive gases used as process gases, such as gases containing oxygen, nitrogen, fluorine, hydrogen and other reactive gases.

In another particular implementation, this disclosure provides a method of forming a thin ruthenium film, the method comprising depositing ruthenium from a target onto a substrate via ion beam deposition in a process chamber, and simultaneously bombarding at least some of the deposited material from the substrate in the process chamber, such as with an assist ion beam where either or both reactive and inert gases are used singly or in combination of multiple gases for primary ions in the ion deposition beam and/or for ions in the assist ion beam.

This disclosure provides methods of forming a thin ruthenium film using reactive ion beam deposition with ion assist, with an apparatus that distributes, in a controllable fashion, both inert and reactive gases in both the ion deposition source and assist ion source, to controllably create both inert and reactive ions in the ion beams. Alternately, the reactive gases are distributed, in a controllable fashion, in the process chamber independent of both the ion deposition source and assist ion source.

The ruthenium can be deposited from the target onto a substrate via ion beam deposition that utilizes an ion beam having a voltage of at least 400V, up to at least 2000V, and having a current at least 100 mA, up to as high as 2500 mA. The ruthenium can be bombarded, or etched from the substrate, using an assist ion beam having a voltage of at least 100V and up to at least 1500V. In some embodiments, the assist ion beam has a current no less than 100 mA and as high as 1500 mA.

The fine control of the energetics, energy and flux distributions of the independent ion beams, in combination with independent control of the reactive and process gases, and thus, fine control of the process chamber background pressure simultaneous with independent control of substrate temperature, permits a high degree of control on the reaction between reactive and/or process gases with the ruthenium target and sputtered plume and energetics of the thin film ruthenium deposition in reactive ion beam deposition and hence reactive ion beam deposition is capable of depositing a pure, densified, low resistivity ruthenium thin film.

Under certain appropriate conditions, where a mono-energetic deposition ion beam is directed at a ruthenium target, a sputtered plume of ruthenium atoms is created which is sputtered and directed to a heated and rotated substrate, which is also simultaneously bombarded by a mono-energetic assist ion beam, all of which occurs in the presence of reactive gas species such as gases containing oxygen, nitrogen, fluorine, or hydrogen. Under such conditions, a reaction between the reactive gas species and ruthenium occurs to form a ruthenium compound which then is induced energetically to dissociate spontaneously to form pure dense ruthenium metal film on the substrate and release the reactive gas species. The reactive gas species may be present in the process chamber under such conditions in various manners, for example, via introduction in the deposition ion source with or without other process gases, introduction in the assist ion source with or without other process gases, introduction in the deposition and/or assist ion source neutralizer with or without other process gases, or introduction through an apparatus for gas distribution in the chamber remote from and/or in close proximity to the substrate located on the same plane as the substrate or above or below the substrate. Under such appropriate conditions, a pure dense ruthenium film is deposited with a microstructure characterized by grains all having fiber orientation with 0001 grains oriented with the basal planes parallel to the film surface and a grain size distribution with mean grain size at least three times and up to more than ten times the film thickness. Under other appropriate conditions a pure dense ruthenium film is deposited with a microstructure characterized by grains all having fiber orientation with 0001 grains oriented with the hexagonal 0001 axis parallel to the film surface and a grain size distribution with mean grain size at least three times and up to more than ten times the film thickness.

As a generalization for metal thin film deposition, characteristics such as microstructure, grain size, grain distribution, grain orientation, grain boundaries, purity, morphology and topography all depend on the energetics of the film deposition on the substrate and are a complex function of material, target, substrate, substrate temperature, surface chemistry, energy and flux of the sputtered atoms, process gas species, process reaction at the target, process reaction in the process chamber, background pressure and sputtered atoms energy distribution during film formation.

With the methods described herein, the ruthenium crystalline orientation is controllable, especially, the relative amount of (0001) is increased and the orientation of (0001) basal planes with respect to the film surface is controlled, thus affecting the resistivity and also providing an increased texture of the metal film and formation of a fiber texture. As a result, grains with random orientation are reduced and grains with 0001 orientation are increased. The amount and fraction of (0001) oriented grains in the thin ruthenium films is higher, with the (0001) oriented grains fraction greater than 80%, in some implementations greater than 90%, in other implementations greater than 95%, and in yet some other implementations greater than 99%.

As indicated above, the methods described herein provide thin, low resistivity ruthenium films. For example, the methods provide thin ruthenium films having, e.g., a resistivity no more than 12 $\mu\Omega$-cm, in some implementations no more than 11 $\mu\Omega$-cm, in some implementations no more than 10 $\mu\Omega$-cm, and even no more than 9 $\mu\Omega$-cm (that is, 9 $\mu\Omega$-cm and less). The methods described herein provide ruthenium films ranging in thickness from 10 to 30 nanometers and having a resistivity of 8 $\mu\Omega$-cm to 12 $\mu\Omega$-cm. In some ruthenium films, the resistivity ranges from 8 $\mu\Omega$-cm to 10 $\mu\Omega$-cm, and in other films ranges from 9 $\mu\Omega$-cm to 10 $\mu\Omega$-cm. The methods described herein can also provide a ruthenium film having a thickness ranging from 15 to 25 nanometers having a resistivity ranging from 8 $\mu\Omega$-cm to 10 $\mu\Omega$-cm, as well as provide a ruthenium film having a thickness ranging from 15 to 20 nanometers with a resistivity of 9 $\mu\Omega$-cm to 10 $\mu\Omega$-cm. In some instances, the methods provide thin ruthenium films having a low resistivity at different thickness, such as less than 91$\mu\Omega$-cm for film thickness of 50 nm and thicker, less than 9.5 $\mu\Omega$-cm for film thickness of 35 nm and thicker, less than 11 $\mu\Omega$-cm for film thickness of 20 nm and thicker, less than 15 $\mu\Omega$-cm for film thickness of 10 nm and thicker or less than 20 $\mu\Omega$-cm for film thickness of 2 nm and thicker.

This disclosure also describes an ion beam deposition system having an ion beam deposition source, a target mounted on a turret assembly with the ability to move in a circular path and create an index of position relative to an ion beam from the ion beam deposition source, an assist ion beam source, a substrate assembly for retaining a substrate, and a heater configured to heat the substrate to a temperature of at least 300° C., in some embodiments at least up to 400° C. The motion of the target in the turret assembly is referenced through an index and which causes the target face to geometrically present a relative angle with the ion deposition source and substrate assembly and changing the index position of the target through motion in the turret results in the target having an angle of about 0 to about 70 degrees (e.g., 20 to 35 degrees, e.g., 50 to 60 degrees) relative to an ion beam from the ion beam deposition source, the assist ion beam source and the substrate assembly. The substrate assembly is positioned to receive a sputter plume from the target and to receive an ion beam from the assist ion beam source, and the substrate assembly may be fixed in some embodiments or pivotable in other embodiments in relation to the target and to the assist ion beam source.

In the following description, reference is made to the accompanying drawing that forms a part hereof and in which is shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples, including the figures, provided below. In some instances, a reference numeral may have an associated sub-label consisting of a lower-case letter to denote one of multiple similar components. When reference is made to a reference numeral without specification of a sub-label, the reference is intended to refer to all such multiple similar components.

Turning to the figures, FIG. 1 illustrates a system 100 according to the present disclosure, the system 100 including an ion beam deposition (IBD) system and an assist ion or ion beam system. The system 100 also has one or more ion beam neutralizers and their associated gas distribution systems. The system 100 may have an apparatus for introduction of reactive gas species into the process chamber.

The system 100 includes various elements from a conventional IBD system, such as a chamber 102 having therein an ion beam source 104, a target assembly 106, and a substrate assembly 108 for supporting a substrate 118. The substrate 118 may be formed of, for example, one or multiple layers of silicide(s), nitride(s), oxide(s), metal(s) including alloys, or ceramic(s).

The ion beam source 104 generates an ion beam 110, which can include a plurality of ion beamlets targeted or directed toward the target assembly 106, which includes at least one target 116, in this illustrated system, a first target 116*a*, a second target 116*b*, and a third target (not seen in FIG. 1), all of which can be ruthenium (Ru) if ruthenium is the metal to be deposited; alternately the target 116 includes a metal from Groups 6 to 11 of the periodic table of the elements, such as but not limited to W, Mo, Ru, Co, Cu, Rh, Ta. For example, if titanium (Ti) is to be deposited in addition to the ruthenium, one or more of the targets 116 includes an amount of titanium, or, one or more of the targets 116 includes dielectric and semiconductor materials such as, but not limited to, nitrides of metals and semiconductors such as titanium nitride, tantalum nitride, silicon nitride, molybdenum nitride, tungsten nitride, oxides of metals and semiconductors such as silicon oxide, titanium oxide, aluminum oxide, silicides of metals and semiconductors such as tungsten silicide, molybdenum silicide, titanium silicide, and other types of metal, dielectric, and semiconductor targets.

The system 100 may include one or more grids 114 proximate the ion beam source 104 for directing the ion beam 110 from the ion beam source 104 to the target 116.

The substrate 118 may have different films, layers, patterns and/or structures on the surface on which the ruthenium is deposited. The films/layers can include nitrides of metals and semiconductors such as titanium nitride, tantalum nitride, silicon nitride, molybdenum nitride, tungsten nitride, oxides of metals and semiconductors such as silicon oxide, titanium oxide, aluminum oxide and other types of metal, dielectric, and semiconductor films, structures and patterns. The films may be deposited in-situ in the same process chamber or may be created and deposited by other methods in other process chambers. The reactive ion beam deposition is capable of depositing low resistivity ruthenium on various such types of metal, dielectric, and semiconductor films, structures and patterns, in-situ or ex-situ.

The source gas used in the ion source 104 is typically a noble gas such as helium, neon, xenon, argon, or krypton, but could also be a reactive gas including, for example, oxygen, nitrogen, fluorine, or hydrogen. The reactive gas and the noble gas can be used either singularly or in any combination, e.g., pure reactive gas, pure noble gas, or any combination of reactive gas(es) and noble gas(es). For example, the reactive gas to noble gas volumetric ratio may be as low as 0.1:1, may be equal volumetric parts of reactive and noble gas such as 1:1, or have reactive gas in larger volumes than noble gases, e.g., 10:1. In some embodiments, the reactive gas to noble gas volumetric ratio may be lower than 0.1:1 or higher than 10:1.

The total volume of gas used in the system, including noble and/or reactive gases in the ion sources, neutralizers, and apparatus for introducing reactive gases in the chamber, may be as low as 1 sccm to as high as 100 sccm.

Also present in the system 100 is a heat source, such as heating element(s) present within the chamber 102 (not shown). The heating element(s) may be, e.g., heating element(s) positioned on the chamber walls, heating element(s) positioned within the chamber, or heating element(s) as part of or connected to the substrate assembly 108. The heating element(s) may be, e.g., conductive coils, another conductive heat source, a radiative heating source (e.g., lamp), or inductive heat source. The heating element(s) may heat the substrate 118 directly or indirectly (e.g., by heating the atmosphere in the chamber 102). The heating element(s) are configured to heat the substrate 118 to a temperature of at least 200° C. In some embodiments, the heating element(s) are configured to heat the substrate 118 to a temperature of at least 250° C.; and in some additional embodiments, the heating element(s) are configured to heat the substrate 118 to a temperature of at least 300° C., at least 400° C., or at least 450° C. The substrate 118 may be heated by the environment (e.g., the temperature of the chamber 102) or may be heated by heating the substrate assembly 108. If heating the substrate 118 by the substrate assembly 108, such heating could also include flowing a gas, e.g., He, Ar, and the like, behind the substrate 118 to transfer heat more effectively.

The ion beam 110, upon striking one of the targets 116, generates a sputter plume 112 of material from the target 116. The ion beam 110 strikes the target 116 at such an angle so that the sputter plume 112 generated from the target 116 travels towards the substrate assembly 108. The sputter plume 112 may be made more or less concentrated so that its resulting deposition of material on the substrate 118 is more effectively distributed over a particular area of the substrate 118.

In some implementations, the deposition ion beam 110 induces a reaction between the gas species forming the ion beam 110 and the target 116 and/or between the gas species forming the ion beam 110 and the material that is being deposited by the sputter plume 112. In some implementations, the sputter plume 112 includes ruthenium atoms and/or ruthenium-reactive gas compounds.

The system 100 also includes an assist ion beam system 130 that provides a source of ions that bombards the substrate 118 so that material on the substrate 118 is removed or modified. The assist ion beam system 130 may be referred to an ion beam etching system, or the like. The assist ion beam system 130 includes an ion beam source 132 that generates an assist ion beam 134, that can include a plurality of ion beamlets, targeted or directed toward the substrate assembly 108, particularly toward the substrate 118. The assist ion beam 134 controls the net amount of material deposited on the substrate 118 by the sputter plume 112. In some implementations, the assist ion beam 134 modifies the material that is being deposited by the sputter plume 112. The assist ion beam 134 may induce a reaction between the gas species forming the ion beam 110 and the material that is being deposited by the sputter plume 112 and/or between the gas species forming the ion beam 110 and the material in the sputter plume 112; the assist ion beam 134 may also or alternately induce the dissociation of reacted components being deposited on the substrate 118. In some implementations, the assist ion beam 134 controls the reaction between the material being deposited on the substrate 118 by the sputter plume 112 and the reactive gas components and also the disassociation reaction of material being deposited on the substrate 118.

The assist ion beam system 130 may be, for example, a broad ion beam system, e.g., having a PBN for generating low energy electrons. The assist ion beam energy ranges in voltage from at least 100V to 2000V, but in some implementations, no more than 1000V. Both the ion beam source 132 and PBN (if present) may use the same gases as the ion source 104.

The target assembly 106 is positioned so that the sputter plume 112 strikes the desired and selected target 116 at a predetermined desired angle. In one example implementation, the target assembly 106 is attached to a turret fixture 117 that allows the target 116 to be rotated or moved in a desired manner, including rotation of the entire target assembly 106 about an axis 126 or pivoting of the target 116 or target assembly 106 to change the angle of the target 116 in relation to the axis 126. In one other example implementation, the target assembly 106 permits motion of the target 116 fixed to the turret fixture 117 in a manner to index the relative position of the target 116 with respect to the substrate 118 and ion sources 104, 132. The motion of the target 116, due to the turret 117, is referenced through an index and which causes the face of the target 116 to geometrically present a relative angle with the ion deposition source and substrate assembly 108 and changing the index position of the target 116 through motion in the turret 117 results in the target 116 having an angle of about 0 to about 70 degrees relative to an ion beam 110 from the ion beam source 104, the assist ion beam source 132 and the substrate assembly 108. The motion of the targets 116 on the turret 117 also allows for the selection of the desired target in the multi-target turret through the indexing of the position of each individual target.

The target assembly 106 is positioned so that the sputter plume 112 strikes the desired and selected target 116 at a predetermined desired angle. In one example implementation, the target assembly 106 is attached to a turret fixture 117 that allows the target 116 to be rotated or moved in a desired manner, such as rotation of the entire target assembly 106 about an axis 126, or pivoting of the target 116 or target assembly 106 to change the angle of the target 116 in relation to the axis 126. In one other example implementation, the target assembly 106 permits motion of the target 116 fixed to the turret fixture 117 in a manner to index the relative position of the target 116 with respect to the substrate 118 and ion sources 104, 132. The motion of the target 116, due to the turret 117, is referenced through an index and which causes the face of the target 116 to geometrically present a relative angle with the ion deposition source and substrate assembly 108; changing the index position of the target 116 through motion in the turret 117 results in the target 116 having an angle of about 0 to about 70 degrees relative to an ion beam 110 from the ion beam source 104, the assist ion beam source 132 and the substrate assembly 108. The motion of the targets 116 on the turret 117 also allows for the selection of the desired target in the multi-target turret through the indexing of the position of each individual target.

Additionally or alternately, the substrate assembly 108 can be pivotable in relation to the target 116 and to the assist ion beam source 132. In one other example implementation, the substrate assembly 108 can be fixed in a position relative to the ion sources 104, 132 and the turreted target assembly 106 which are so located to create a fixed geometrical relation between all. The fixed geometrical relation between the ion sources 104, 132, turreted target assembly 106, and substrate assembly 108 can differ in different implementations.

Figure 2:
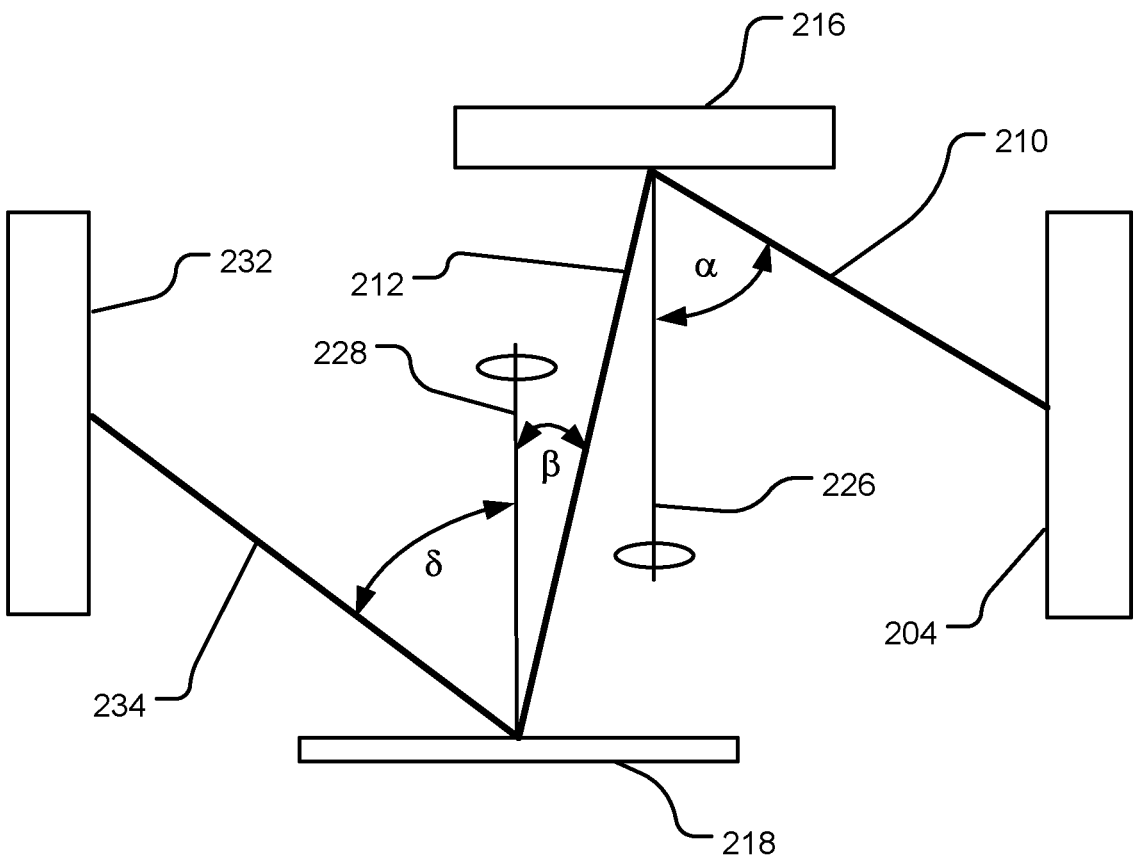
FIG. 2 is a schematic rendering of various angular combinations in an ion beam system.

FIG. 2 shows a schematic rendering showing certain elements from an ion beam deposition system such as the system 100 and various angular combinations. FIG. 2 includes a deposition ion source 204, an assist ion source 232, a target 216 and a substrate 218. The direction perpendicular to the face of the target 216 is indicated as 226 and the direction perpendicular to the face of the substrate 218 is indicated as 228.

From the deposition ion source 204, an ion beam 210 strikes the target 216 forming a sputter plume 212 from the target 216 that travels to and deposits on the substrate 218. Simultaneously, from the assist ion source 232, an assist ion beam 234 travels to and deposits on the substrate 218.

The deposition ion beam 210 forms an angle α (alpha) in relation to the direction 226. The sputter plume 212 forms an angle β (beta) in relation to the direction 228, which is also referred to as a deposition angle. The assist ion beam 234 forms an angle δ (delta) in relation to the direction 228, which is also referred to as an etch angle, assist angle, or the like.

For example, returning to FIG. 1, in one implementation, the substrate assembly 108 can be fixed with the surface of the substrate 118 extending parallel to the bottom of the chamber 102 and/or to level ground, with the deposition ion source 104 located with respect to the turreted target assembly 106 and target 116 to create a geometrical angular relation (e.g., angle β in FIG. 2) in the range of 20 to 25 degrees (e.g., 22 degrees), and simultaneously, the assist ion source 132 is located with respect to the substrate assembly 108 to create a geometrical angular relation (e.g., angle δ in FIG. 2) in the range of 50 to 60 degrees (e.g., 55 degrees), and simultaneously, the target 116 in the turreted target assembly 106 is referenced with the face of the target 116 in an angular relation with the deposition ion source 104 and the substrate assembly 108 (e.g., angle α in FIG. 2) at 30 degrees in one implementation, 25 degrees in another implementation, and 35 degrees in another, with the range of 25 to 35 selected through the rotation of the target 116 in the turret assembly 106. As can be understood from the geometrical dependence, various implementations consisting of various angular relative combinations from 0 degrees to 90 degrees to −90 degrees can be made by so locating the various parts of the system.

Returning to FIG. 1, the deposition ion beam system 100 may be, for example, a broad ion beam system, e.g., having a plasma bridge neutralizer (PBN) for generating low energy electrons. The system 100, particularly the IBD portion of the system 100, can utilize a high energy ion beam having a voltage ranging from 100V to 2000V, or, ranging from 1000V to 2000V. In some implementations, the ion beam has a voltage less than 1000V, whereas in other implementations the ion beam has a voltage greater than 1500V. Both the ion beam source and the PBN (if present) may use the same noble gas(es), reactive gas(es) or combinations thereof as the ion source 104 of the system 100.

The system 100 also includes an apparatus 140 to introduce reactive gases in the chamber 102. The apparatus 140 may introduce the reactive gases in a controlled manner on a plane level (i.e., the same plane) as the substrate 118 or a location closely above or below the plane of the substrate 118. The system 100 typically operates at a process (chamber) pressure of less than $10^{-3}$ torr, e.g., $1 \times 10^{-4}$ to $1 \times 10^{-5}$ torr. The system 100 typically operates with reactive gases introduced in the chamber 102 through either one ion source 104 or 132 or both the ion sources 104 and 132 and/or through the neutralizer of either ion source or both and/or through the apparatus 140. Multiple gas sources into the chamber 102 may be present in the system 100.

Such a system 100, having an IBD system and an assist ion beam, may be referred to as an ion beam deposition system with assist. When using reactive gases in the process chamber 102 (introduced via various manners), the system 100 may be referred to as a reactive ion beam deposition system.

The system 100, having ion beam deposition with an assist ion beam, can be used to deposit, deposit and modify, and/or deposit and etch, with or without reactive gases, either simultaneously or sequentially or interpedently. The reactive ion beam deposition of ruthenium process is summarily described with respect to FIG. 3 below. In one embodiment, use of the system 100 allows control of the net deposition rate of the target material (e.g., ruthenium) on the substrate 118. In another embodiment using the system 100, the net reaction between the target material (e.g., ruthenium) and reactive gas (e.g., oxide), and the dissociation of reacted products (e.g., ruthenium oxide) to form pure metal (e.g., ruthenium), is controlled. In another embodiment using the system 100, the microstructure of the target material (e.g., ruthenium) deposited on the substrate 118 can be modified as desired, e.g., to obtain a desired orientation of the grains by controlling growth habit to form a highly oriented textured film with, in some cases, fiber texture along specific planes such as low resistivity hexagonal basal (0001).

Again returning to FIG. 1, the direction perpendicular to the substrate 118 is indicated as 128. In the embodiment shown in FIG. 1, this direction 128 is tilted towards the sputter plume 112 and the assist ion beam 134. In general, the angle the surface of the substrate 118 makes with the sputter plume 112 is called the deposition angle and the angle the surface of the substrate 118 makes with the assist ion beam 134 is called the etch angle. The angles are measured with reference to the direction 128 perpendicular to the surface of the substrate 118. By tilting the substrate assembly 108 retaining the substrate 118 and thereby tilting the direction 128, one can adjust the deposition angle and the etch angle simultaneously. The angles may be adjusted during the operation of the system, periodically, incrementally or continuously.

The angles can be pre-determined angles, fixed in relation to fixed positions of the, e.g., substrate 118, the sputter plume 112, assist ion beam 134 and the turreted target assembly 106. Various different combinations of angles and angular relation between the substrate 118, the ion sources 104, 132 and the turreted target assembly 106 are possible. In certain implementations, the deposition angle can range from 0 to +75 degrees and the etch angle can range from 0 to +75 degrees. In other implementations, the deposition angle can range from +10 to −70 degrees and the etch angle can also range from +10 to −70 degrees. In one embodiment of the system 100 shown in FIG. 1, the etch angle is fixed at 55 degrees and the deposition angle is 22 degrees.

Those skilled in the art will appreciate that the relative positions of the sputter plume 112 and the assist ion beam 134 can be such that the deposition angle and the etch angle can be adjusted over a range of angles depending on the required or desired film property. In another embodiment, the turreted target assembly 106 can have an angle from 0 degrees to 70 degrees relative to the ion beam from the ion beam deposition source 104 through the motion in the turret 117 indexing a relative position of the target 116. Additionally, the skilled artisan will appreciate that, in one embodiment of system 100, by tilting the substrate assembly 108 and thereby the direction 128, one can position the substrate 118 in such a manner so that both the sputter plume 112 and the assist ion beam 134 reach the substrate.

By adjusting the net deposition rate of metal onto the substrate 118, not only is the thickness of the deposited material controlled, but the physical properties of the deposited material, including microstructure and grain growth, can be controlled. The net deposition can be adjusted, e.g., by adjusting the rate of deposition by the IBD and the rate of modification by the assist ion beam, by adjusting the net deposition rate of pure metal onto the substrate 118, by adjusting the rate of reaction between the gas species introduced into the chamber and the metal in the target 116 and/or the sputter plume 112, and by the rate of dissociation of the reacted metal compounds to form pure metal. The net deposition rate is greater than 10 angstroms/minute, sometimes greater than 100 angstroms/minute, and in some implementations, greater than 1 angstrom/second, or even greater than 5 or 10 angstrom/second. In some implementations, the net deposition rate is no more than 500 angstroms/minute, often no more than 10 angstroms/second. An example of a suitable range for the net deposition rate is 6 to 8 angstroms/second, and another example is 100-500 angstroms/minute.

Additionally or alternately, the temperature of the system, e.g., the temperature of the surface of the substrate 118, is a factor in obtaining thin, low resistivity metallic films. By having the substrate 118 at a temperature of at least 200° C., in some implementations at least 250° C., and in other implementations at least 300° C., and in other implementations at least 350° C., and in other implementations at least 400° C., low resistivity ruthenium films can be obtained; typically, the substrate temperature is no greater than 600° C. The increased temperature affects the phase and crystal orientation and grain size of the resulting deposited material.

In another embodiment, low resistivity ruthenium films are deposited onto the substrate 118 using single or multiple steps having different net deposition rates of metal. The net deposition rate can be adjusted by adjusting one or both of the rate of deposition by IBD and the rate of modification by the assist ion beam 134, with or without heating of the substrate 118, and with or without use of reactive gases in different volumetric ratios with respect to the noble gases introduced in the chamber 102. Different combinations of IBD deposition rates from the deposition ion beam 110 and the assist ion beam 134, with or without reactive gases in different volumetric ratios, can be selected by adjusting the deposition ion beam energy, e.g., in the range of 100V to 2000V, and assist ion beam energy, e.g., in the range of 100V to 2000V. Additionally or alternately, the ion beam flux of the deposition ion beam 110 and the flux of the assist ion beam 134 can be adjusted, e.g., simultaneously, to adjust the energy of the ion beams.

Certain combinations of IBD deposition rates (i.e., ion beam 110) and assist ion beam rates (i.e., assist ion beam 134), with or without reactive gases, can be chosen to selectively grow ruthenium thin films with desired grain orientations and thin film textures, such as with a high fraction of (0001) grains.

In a similar manner, certain combinations of IBD deposition rates and assist ion beam modification rates, with or without reactive gases, can be chosen to selectively affect the growth of grains and deposit low resistivity thin films of ruthenium with large grain sizes, e.g., with mean grain size greater than three times and as much as up to ten times the film thickness, e.g., equal to more than 100 nm mean grain size for a 10 nm film and even greater than 100 nm mean grain size and even greater than 250 nm mean grain size for a 10 nm thick film, and even greater than 250 nm mean grain size for 10 nm films and thicker.

Thusly, by using different combinations of IBD deposition rates and assist ion beam modification rates, in single or multiple (different) steps, with or without reactive gases, low resistivity ruthenium thin films can be deposited. By using a certain combination of IBD deposition rate(s) and assist ion beam modification rate(s), with or without reactive gases, a desired texture, such as ruthenium (0001) with hexagonal basal planes parallel to the film surface or alternately such as ruthenium (0001) with hexagonal c-axis parallel to the film surface, can be deposited. The growth of the (0001) ruthenium grains can be affected by using same or different combinations of IBD deposition rate(s) and assist ion beam modification rate(s), with or without reactive gases.

Low resistivity ruthenium films with high smoothness (e.g., as measured by surface roughness of less than 10 Angstroms or less than 5 Angstroms) can also be deposited using the system 100 and the methods described herein. Surface roughness is a measure of the surface irregularity or unevenness of the surface plane of a thin film; the surface roughness referred to here is the rms roughness of the metal thin film. Surface roughness of thin metal films can be measured using transmission electron microscopy (TEM) and atomic force microscopy (AFM). For metal thin films, the surface roughness plays a key role in resistivity as rough surfaces can form surface states, traps, and scattering sites for charge carriers, all affecting the resistivity of the film. In addition, rough thin film surfaces can have deleterious impacts on integration and further processing of the metal thin films. Hence, there is great interest in depositing smooth thin films or reducing the roughness of thin films.

A smooth ruthenium film can be formed on the substrate 118 using single or multiple steps of different net deposition rate(s) of material by adjusting the combination of rate of deposition and the rate of modification by assist ion beam, with or without heating of the substrate 118 and with or without the use of reactive gases. Certain combinations of IBD deposition rates and assist ion beam modification rates with or without use of reactive gases can be chosen to selectively grow ruthenium thin films with a uniform size distribution, such as typified by a low standard deviation of the grain size distribution from the average. Controlled uniform grain growth and uniform grain size distribution and desired grain size orientation during thin film deposition permits smooth low resistivity of ruthenium thin films when deposited by combining appropriate IBD deposition rate(s) and assist ion beam modification rate(s), with or without heat, and with or without reactive gases.

FIG. 3 provides a general method 300 for forming a smooth ruthenium film on a substrate.

In a step 310, a deposition ion beam is directed toward a ruthenium-containing target to sputter ruthenium atoms from the target. In a step 320, the sputtered ruthenium atoms are directed to a substrate, which is at a heated temperature and is being rotated about a central axis. At least partially simultaneously with the step 320, in a step 330, the substrate is bombarded with an assist ion beam. Also at least partially simultaneously with the step 320 and/or the step 330, in a step 340, reactive gas(es) is introduced into the process chamber; in some embodiments, the reactive gas may be a noble gas species. The resulting product, in a step 350, is a layer of at least essentially pure, dense, and low resistivity ruthenium.

Figures 4A, 4B, 4C, 4D:
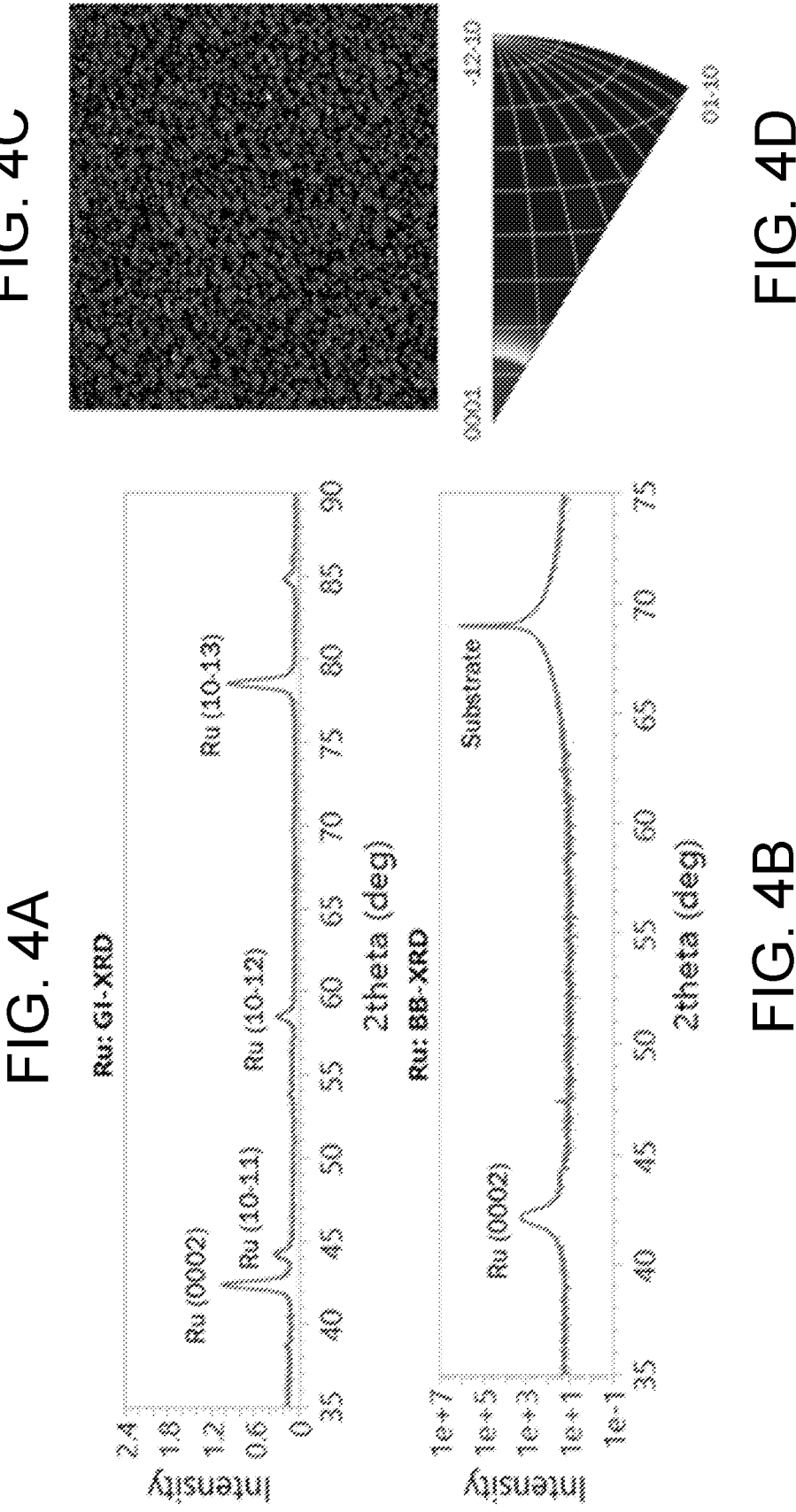
FIG. 4A is a graphical representation of a glancing angle geometry X-ray theta-2theta scan for a sample ruthenium thin film.
FIG. 4B is a graphical representation of a Bragg- Brentano geometry X-ray theta-2theta scan.
FIG. 4C is an electron backscattered diffraction (EBSD) micrograph.
FIG. 4D is an inverse pole figure for hexagonal crystal system serving as the grain orientation key for the crystal direction.

FIG. 4A shows a graph of a glancing angle geometry X-ray theta-2theta scan and FIG. 4B shows a graph of a Bragg-Brentano geometry X-ray theta-2theta scan of a 20 nm thick ruthenium thin film deposited by reactive ion beam deposition on a titanium nitride substrate. For FIG. 4A, the X-ray diffractograms probe the ruthenium film structure with the glancing angle geometry probing the planes that are not parallel to the film surface and, for FIG. 4B, the Bragg-Brentano geometry probes the planes that are parallel to the film surface. The high intensity (0002) ruthenium peak in FIG. 4B, the Bragg-Brentano geometry, and concomitant lower intensity of the (0002) peak in FIG. 4A, glancing angle geometry, is indicative of (0001) orientation with the basal hexagonal planes oriented parallel to the surface of the film. In the (FIG. 4B) Bragg-Brentano geometry, the substrate peak is also seen.

FIG. 4C shows an electron backscattered diffraction (EBSD) micrograph of the same ruthenium thin film and FIG. 4D shows the inverse pole figure for hexagonal crystal system serving as the grain orientation key for the crystal direction. Each color/shading in these images signifies a crystal direction as determined by inverse pole analysis. The color/shade in FIG. 4C shows a predominant (0001) grain orientation, having a fiber texture, with greater than >95% of the grains showing (0001) orientation with basal hexagonal planes oriented parallel to the film surface. In addition, the (0001) oriented grains are substantially larger with a mean grain size of at least three times as large as the 20 nm film thickness.

Additional testing and characterization of the ruthenium thin film for impurity content shows that the film is pure ruthenium within detection limits with no discernible incorporation of any reactive component and is a pure, densified ruthenium thin film (at least 99% of theoretical density of ruthenium, which is 12.2 $g/cm^3$). The resistivity of the film is <11 $\mu\Omega$-cm.

From the film deposited and shown in FIGS. 4A through 4D, it is evident that the microstructure, grain size and grain orientation of a ruthenium metal film can be controlled by using reactive ion beam deposition. For example, by controlling the microstructure, grain size and grain orientation of a pure, dense, ruthenium film (formed by using reactive ion beam deposition) having a low resistivity over a range of thicknesses can be obtained; examples are shown in FIGS. 5A and 5B.

Figure 5A:
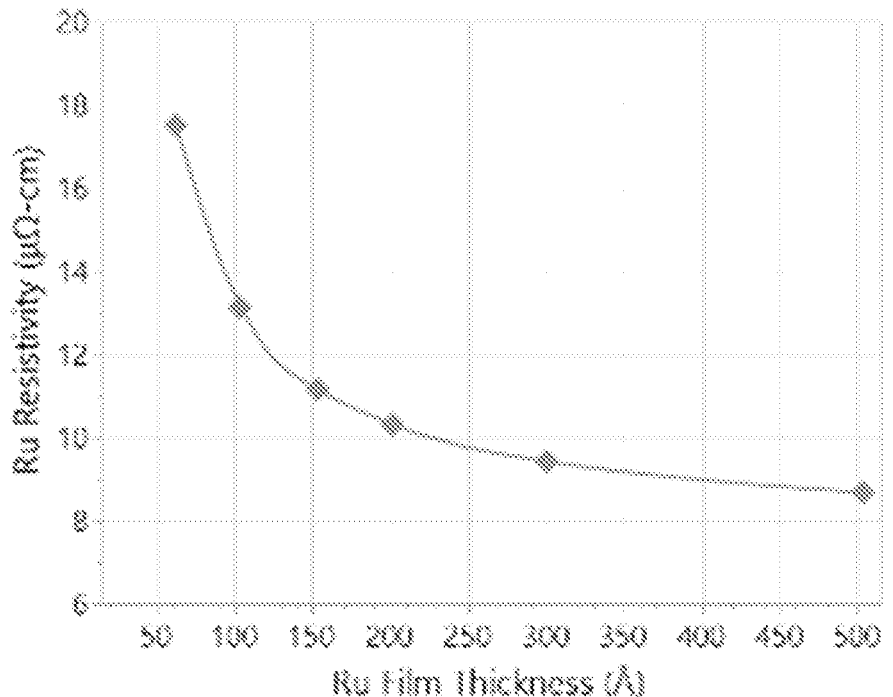
FIG. 5A is a graphical representation of the resistivity as a function of thickness for a ruthenium thin film on a silicon underlayer.
Figure 5B:
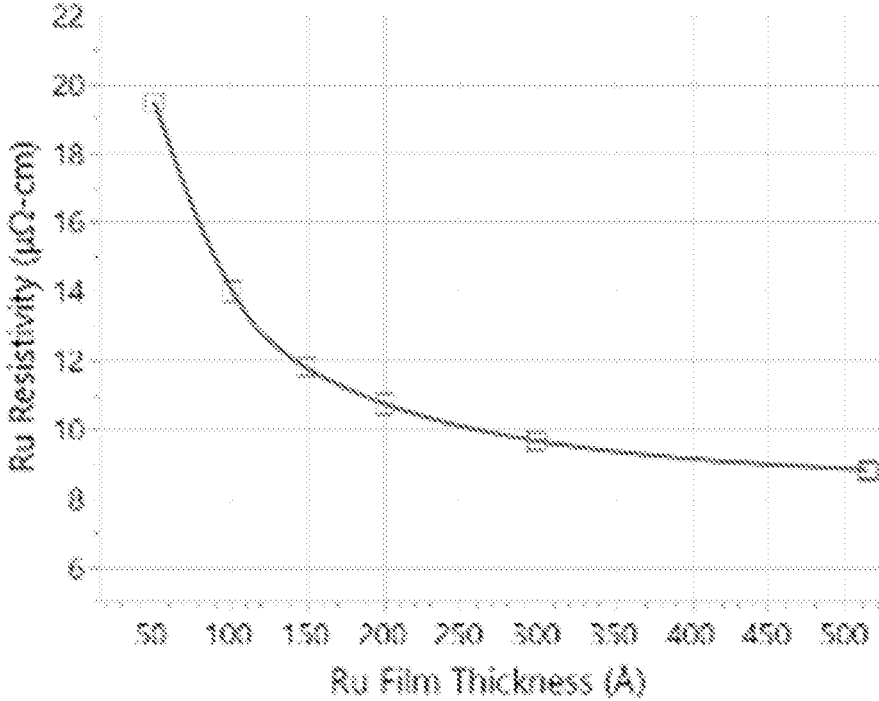
FIG. 5B is a graphical representation of the resistivity as a function of thickness for a ruthenium thin film on a tantalum nitride underlayer.

FIGS. 5A and 5B show the resistivity of a ruthenium film structures as a function of thickness on different underlayer films. FIG. 5A shows the resistivity of ruthenium films as a function of thickness on a silicon oxide underlayer. FIG. 5B shows the resistivity of ruthenium films as a function of thickness on tantalum nitride underlayer. The graphs show that for both structures, the resistivity increases as a quadratic equation as its thickness decreases.

Deposition of low resistivity ruthenium thin films using a reactive ion beam deposition system or process can be done in conjunction with the ion beam deposition and/or reactive ion beam deposition of other films or layers. One or more dielectric, metal, or semiconductor thin films can be formed, in-situ, in the same process chamber as the ruthenium film by various different sequences and combination of steps, layer with the ruthenium film, through the use of a multi-target turret assembly and additional targets as needed to deposit the other films or layers. The system (e.g., the system 100 of FIG. 1) allows for the deposition of single and multiple thin films of dielectric, metal, and semiconductor materials, all in-situ, in the same process chamber as the ruthenium film, without requiring any process breaks.

FIG. 6 shows an example multi-layered structure 600 having a substrate 602 with a ruthenium thin film 604 thereon. Positioned between the ruthenium thin film 604 and the substrate 602 is an underlayment film 606. The ruthenium thin film 604 can be directly on and in contact with the underlayment film 606. Positioned over the ruthenium thin film 604 is a capping layer 608. The capping layer 608 can be directly on and in contact with the ruthenium thin film 604.

Materials for the underlayment film 606 and the capping layer 608, independently, include dielectric and semiconductor materials such as silicides (e.g., tungsten silicide, titanium silicide, nickel silicide, cobalt silicide, molybdenum silicide), nitrides (e.g., titanium nitride, tantalum nitride, silicon nitride, molybdenum nitride, tungsten nitride, aluminum nitride, gallium nitride), and oxides (e.g., silicon oxide or silicon dioxide, hafnium oxide, titanium oxide, aluminum oxide), and can include metals (e.g., titanium, copper, molybdenum, tungsten, tantalum). The underlayment film 606 and the capping layer 608 may be the same or different materials, including the same material at different stochiometric concentrations.

The underlayment film 606 and the capping layer 608, independently, may be thinner than the ruthenium thin film 604, may be thicker than the ruthenium thin film 604, or may be the same thickness as the ruthenium thin film 604. Typically, however, the ruthenium thin film 604 is thicker than any underlayment film 606 and any capping layer 608, e.g., on the order of at least 5×, in some embodiments at least 10×, and in other embodiments at least 15×.

In one particular embodiment, the underlayment film 606 has the thickness of about 1.5 nm, the ruthenium film 604 has a thickness of about 20 nm, and the capping layer 608 has a thickness of about 4 nm.

In another particular embodiment, the underlayment film 606 has the thickness of about 1.5 nm, the ruthenium film 604 has a thickness of about 20 nm, and the capping layer 608 has a thickness of about 2 nm.

The structure 600 and variants thereof can have application as wiring and interconnect elements for integrated circuit devices used for logic and memory circuits.

Figure 7:
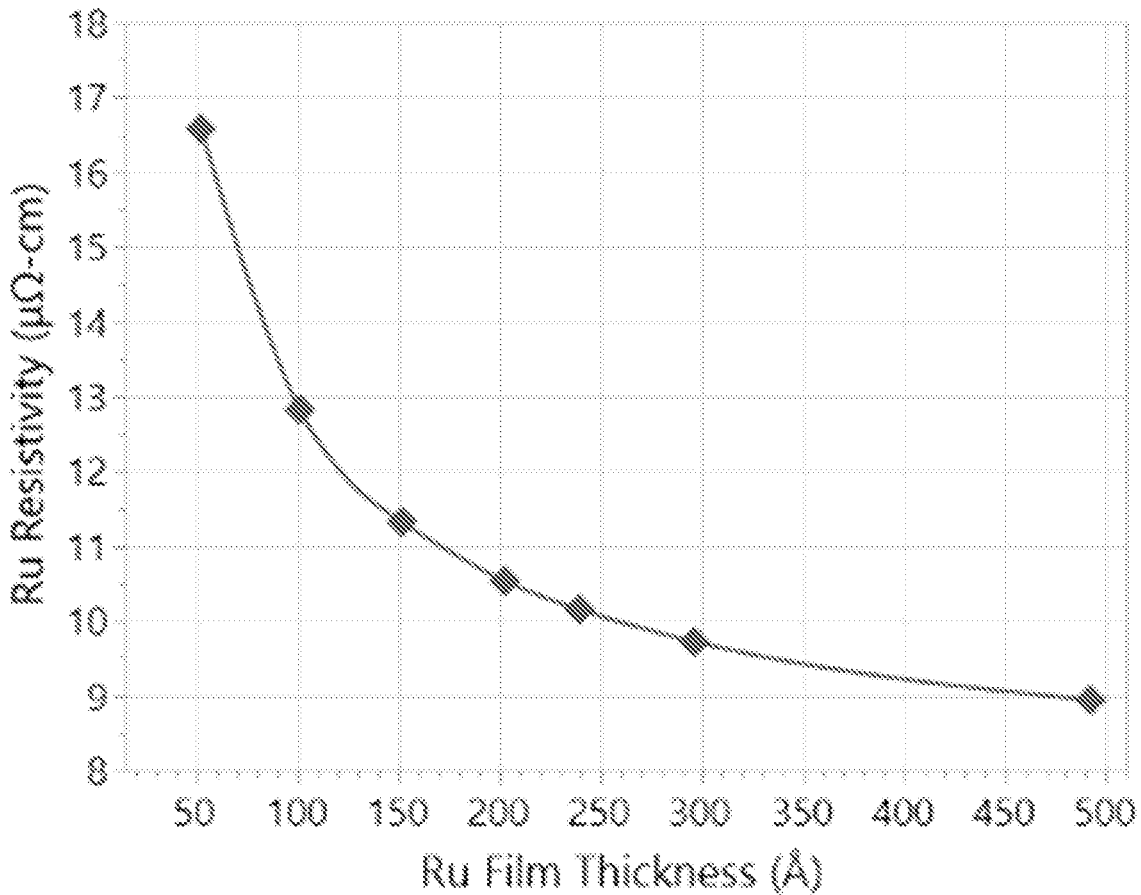
FIG. 7 is a graphical representation of the resistivity as a function of thickness for a multi-layer ruthenium thin film structure.

FIG. 7 shows the resistivity of a multi-layer ruthenium film as a function of thickness; the multi-layer film has a 1-10 nm thick TiN underlayer, a 5-50 nm thick center Ru layer, and a 4 nm thick TiN top layer. The graph shows that the resistivity increases as a quadratic equation as its thickness decreases.

FIG. 8 shows a general method 800 for forming a multifilm or multi-layer structure, such as the structure 600, where the pure, dense, low resistivity ruthenium thin film is deposited by reactive ion beam deposition on top of an underlayer thin film, deposited by reactive ion beam deposition just prior to the reactive ion beam deposition of the ruthenium film, and on which another thin film, a capping thin film, is deposited by reactive ion beam deposition, all deposition done in-situ in the same process chamber.

In a step 810, an appropriate target is selected for deposition of a underlayer thin film. In a step 820, the underlayer film is deposited via reactive ion beam deposition. After deposition of the underlayer film, a ruthenium-containing target is selected for deposition of a ruthenium film in a step 830 and in a step 840, the ruthenium film is deposited via reactive ion beam deposition on the underlayer film. Next, in a step 850, an appropriate target is selected for deposition of a capping film. In a step 860, the capping film is deposited on the ruthenium film via reactive ion beam deposition. With such a method 800, a multi-layer film, with ruthenium between two layers, can be formed.

If the low resistivity ruthenium film is to be deposited on an underlayer with no capping over the ruthenium, the steps for depositing the capping thin film (steps 850, 860) are omitted and similarly, if the low resistivity ruthenium film is to be deposited on the substrate with no additional underlayer thin film and with only capping, the steps for depositing the underlayer thin film (steps 810, 820) are omitted. If only the low resistivity ruthenium thin film is desired to be deposited on the substrate without an underlayer thin film or capping thin film, the steps for depositing the underlayer thin film and capping thin film (steps 810, 820, 850, 860) are omitted, leaving steps 830 and 840.

As one example, an underlayer thin film of titanium nitride (e.g., 1 to 2 nm thick) is deposited onto a substrate using reactive ion beam deposition using nitrogen gas as the reactive gas species and argon as the noble gas species in the ion beam deposition source with a titanium target in a multi-target turret assembly. The nitrogen and argon are provided at a volumetric ratio of 1:1; the gas flow rate can be up to about 20 sccm. An appropriate energy and flux value is used for the ion beams.

After the titanium nitride underlayer film is deposited, the ruthenium target is used from the multi-target turret assembly to deposit a low resistivity ruthenium thin film (e.g., 10 to 20 nm thick), in-situ, using reactive ion beam deposition directly on top of the titanium nitride underlayer thin film. The deposition of ruthenium may be done in a single or multiple steps. Oxygen can be used as a reactive gas species and xenon as a noble gas species, at a volumetric ratio of reactive gas to noble gas of at least 1:10 to as high as 10:1. A flow rate of the gases can be at least 1 to as high as 100 sccm. In an alternate example, an oxygen to xenon volumetric ratio of 1:10 is used with a total flow rate of 15 sccm, where xenon is used in the deposition ion source, and both xenon and oxygen are used in the assist ion source.

The use of the deposition ion beam and assist ion beam, in combination, results in the deposition of pure, dense, low resistivity ruthenium through the reaction of oxygen with ruthenium atoms to form ruthenium oxide followed by an induced disassociation of ruthenium oxide to form pure ruthenium and thus a resultant, oxide-free, pure ruthenium thin film (e.g., at least 99% ruthenium).

The reactive gas, for any of the thin films, may be introduced via any one or more of the deposition ion source, the assist ion source, the deposition ion source neutralizer, the assist ion source neutralizer, and the apparatus for introducing the reactive gas in the chamber.

After the low resistivity ruthenium thin film is deposited on the underlayer thin film, a capping thin film of titanium nitride (e.g., 2 to 4 nm thick) is deposited directly onto the ruthenium thin film, in-situ, using reactive ion beam deposition. Nitrogen gas can be used as the reactive gas species and argon as the noble gas species in the ion beam deposition source with a titanium target in the multi-target turret assembly. The argon gas flow can be up to 20 sccm, with a nitrogen to argon volumetric ratio of 1:1; other gas volume and volumetric ratios can be used in other implementations.

As a result of the multiple reactive ion beam depositions, a multi-film structure such as the one shown in FIG. 6 is formed.

Thus, the microstructure, grain size and grain orientation, purity, and density of ruthenium thin films can be controlled by using ion beam deposition with an assist ion beam. A low resistivity ruthenium film can be deposited on various kinds of substrates including but not limited to silicides (e.g., tungsten silicide, titanium silicide, nickel silicide, cobalt silicide), nitrides (e.g., titanium nitride, aluminum nitride, tantalum nitride), oxides (e.g., silicon oxide or silicon dioxide, hafnium oxide), and metals (e.g., titanium, copper, molybdenum, tungsten, tantalum, and alloys), and ceramics. An underlayer film and/or a capping layer can be deposited, in-situ, in the same processing system as the ruthenium film.

From the foregoing, it will be appreciated that specific embodiments of the invention have been described herein for purposes of illustration, but that various modifications may be made without deviating from the scope of the invention. Accordingly, the invention is not limited except as by the appended claims.

Although the technology has been described in language that is specific to certain structures and materials, it is to be understood that the invention defined in the appended claims is not necessarily limited to the specific structures and materials described. Rather, the specific aspects are described as forms of implementing the claimed invention. Because many embodiments of the invention can be practiced without departing from the spirit and scope of the invention, the invention resides in the claims hereinafter appended.

Various features and details have been provided in the multiple designs described above. It is to be understood that any features or details of one design may be utilized for or with any other design, unless contrary to the process, construction or configuration. Any variations may be made. For example, processing time, pressure, temperature, etc. may be varied.

The above specification and examples provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about," whether or not the term "about" is immediately present. Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "bottom," "lower", "top", "upper", "beneath", "below", "above", "on top", "on," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

What is claimed is:

1. A method of forming a ruthenium film having a thickness at least 10 nm, a resistivity less than 15 μΩ-cm, and a polycrystalline structure comprising grains having a (0001) orientation, the method comprising:
depositing a ruthenium film from a ruthenium target onto a substrate via a deposition ion beam from a deposition ion source in a process chamber in the presence of one or both of a first reactive gas species and a first noble gas species, the substrate at a temperature of at least 250° C.; and
simultaneously bombarding at least some of the deposited ruthenium in the process chamber with an assist ion beam from an assist ion source in the presence of one or both of a second reactive gas species and a second noble gas species,
wherein any of the first reactive gas species, the second reactive gas species, the first noble gas species, and the second noble gas species are introduced to the process chamber by any one or more of the deposition ion source, the assist ion source, a deposition ion source neutralizer, and an assist ion source neutralizer.

2. The method of claim 1, wherein the depositing is in the presence of the first reactive gas species and the bombarding is in the presence of the second noble gas species.

3. The method of claim 1, wherein the depositing is in the presence of the first noble gas species and the bombarding is in the presence of the second reactive gas species.

4. The method of claim 1, wherein the depositing is in the presence of the first reactive gas species and the bombarding is in the presence of the second reactive gas species.

5. The method of claim 1, wherein the depositing is in the presence of the first noble gas species and the bombarding is in the presence of the second noble gas species.

6. The method of claim 1, wherein the depositing is in the presence of both the first reactive gas species and the first noble gas species.

7. The method of claim 1, wherein the bombarding is in the presence of both the second reactive gas species and the second noble gas species.

8. The method of claim 1, wherein the first reactive gas species is different than the second reactive gas species.

9. The method of claim 1, wherein the first noble gas species is different than the second noble gas species.

10. The method of claim 1, wherein the substrate is at a temperature of at least 300° C.

11. The method of claim 1, wherein the first reactive gas species and the second reactive gas species comprises at least one of oxygen, nitrogen, nitric oxide (NO), nitrogen dioxide ($NO_2$), ammonia ($NH_3$), fluorine, fluoride, and hydrogen.

12. The method of claim 1, wherein the first noble gas species and the second noble gas species is at least one of helium, neon, xenon, argon and krypton.

13. The method of claim 1, wherein the depositing the ruthenium film utilizes an ion beam having a voltage of at least 400 V and a beam current of at least 100 mA.

14. The method of claim 1, wherein the depositing the ruthenium film utilizes an ion beam having a voltage no greater than 2000 V and a beam current no greater than 2500 mA.

15. The method of claim 1, wherein the assist ion beam for simultaneously bombarding at least some of the deposited ruthenium has a voltage of 100 V to 1500 V and a beam current of 100 mA to 1500 mA.

16. The method of claim 1, further comprising:
prior to depositing the ruthenium film, depositing an underlayer film onto the substrate in-situ in the process chamber, and
depositing the ruthenium film on and in contact with the underlayer film.

17. The method of claim 1, further comprising:
after depositing the ruthenium film, depositing a capping layer on and in contact with the ruthenium film in-situ in the process chamber.

18. A method of forming a ruthenium film having a thickness at least 10 nm, a resistivity less than 15 μΩ-cm, and a polycrystalline structure comprising grains having a (0001) orientation, the method comprising:
depositing a ruthenium film onto a substrate from a first target with a deposition ion beam in a process chamber in the presence of at least one of a first reactive gas species and a first noble gas species, the substrate at a temperature of at least 250° C.; and
simultaneously etching at least some of the deposited ruthenium in the process chamber with an assist ion beam in the presence of at least one of a second reactive gas species and a second noble gas species,
wherein any of the first reactive gas species, the second reactive gas species, the first noble gas species, and the second noble gas species are introduced to the process chamber, independently, via any one or more of the deposition ion beam, the assist ion beam, a deposition ion source neutralizer, and an assist ion source neutralizer.

19. The method of claim 18, further comprising:

prior to depositing the ruthenium film, depositing an underlayer film onto the substrate from a second target in the process chamber; and after depositing the ruthenium film, depositing a capping layer onto the ruthenium film from a third target in the process chamber, with the first target, second target, and third target all in the process chamber simultaneously.

20. A ruthenium film comprising:

a thickness at least 10 nm, a resistivity less than 15 $\mu\Omega$-cm, and a polycrystalline structure comprising grains having a (0001) orientation.

21. The ruthenium film of claim 20, wherein:

the thickness is at least 20 nm, the resistivity is less than 11 $\mu\Omega$-cm, and the crystalline structure has at least 95% of the grains having the (0001) orientation.

22. The ruthenium film of claim 20, wherein:

the thickness is at least 50 nm, the resistivity is less than 9 ud$\mu\Omega$-cm, and the crystalline structure has at least 95% of the grains having the (0001) orientation.

23. The ruthenium film of claim 20, wherein:

the grains have a mean grain size at least three times the thickness of the ruthenium film.

24. The ruthenium film of claim 20, wherein:

the grains have the (0001) orientation parallel to a surface of the ruthenium film.

25. The ruthenium film of claim 20, wherein:

the grains have a (0001) orientation with hexagonal basal planes parallel to a surface of the ruthenium film.

26. The ruthenium film of claim 20, wherein:

the grains have a (0001) orientation with hexagonal c-axis planes parallel to a surface of the ruthenium film.

* * * * *